(12) United States Patent
Byun et al.

(10) Patent No.: US 12,062,734 B2
(45) Date of Patent: Aug. 13, 2024

(54) DISPLAY DEVICE USING SEMICONDUCTOR LIGHT-EMITTING ELEMENTS, AND METHOD FOR MANUFACTURING SAME

(71) Applicant: LG ELECTRONICS INC., Seoul (KR)

(72) Inventors: Yangwoo Byun, Seoul (KR); Hooyoung Song, Seoul (KR); Kyungho Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 511 days.

(21) Appl. No.: 17/297,874

(22) PCT Filed: Dec. 6, 2019

(86) PCT No.: PCT/KR2019/017154
§ 371 (c)(1),
(2) Date: May 27, 2021

(87) PCT Pub. No.: WO2020/116978
PCT Pub. Date: Jun. 11, 2020

(65) Prior Publication Data
US 2022/0037554 A1  Feb. 3, 2022

Related U.S. Application Data

(60) Provisional application No. 62/776,460, filed on Dec. 6, 2018.

(51) Int. Cl.
*H01L 33/50* (2010.01)
*H01L 25/075* (2006.01)
(Continued)

(52) U.S. Cl.
CPC ...... *H01L 33/0093* (2020.05); *H01L 25/0753* (2013.01); *H01L 33/44* (2013.01);
(Continued)

(58) Field of Classification Search
CPC ......... H01L 25/075–0756; H01L 25/13; H01L 25/16–167; H01L 25/18; H01L 25/0753;
(Continued)

(56) References Cited

U.S. PATENT DOCUMENTS

| 9,048,381 B1 | 6/2015 | Chen | |
| 2002/0037599 A1* | 3/2002 | Ishida | H01L 21/0242 257/E33.074 |

(Continued)

FOREIGN PATENT DOCUMENTS

| EP | 1 310 934 A1 | 5/2003 |
| JP | 2005-108869 A | 4/2005 |

(Continued)

*Primary Examiner* — Mary A Wilczewski
*Assistant Examiner* — Tsz K Chiu
(74) *Attorney, Agent, or Firm* — Birch, Stewart, Kolasch & Birch, LLP

(57) ABSTRACT

Discussed is a display device and a method for manufacturing same, specifically, to a display device using semiconductor light-emitting elements of a few micrometers to tens of micrometers in size, and includes substrate having a wiring electrode, and a plurality of semiconductor light-emitting elements electrically connected to the wiring electrode, wherein each of the plurality of light-emitting elements includes of a buffer layer and an oxide layer formed on the buffer layer, and the oxide layer includes of an oxide of the buffer layer.

13 Claims, 11 Drawing Sheets

(51) Int. Cl.
*H01L 33/00* (2010.01)
*H01L 33/22* (2010.01)
*H01L 33/44* (2010.01)
*H01L 33/62* (2010.01)

(52) U.S. Cl.
CPC .............. *H01L 33/50* (2013.01); *H01L 33/62* (2013.01); *H01L 2933/0025* (2013.01); *H01L 2933/0066* (2013.01)

(58) Field of Classification Search
CPC ............. H01L 33/507; H01L 2924/181; H01L 2924/19107
See application file for complete search history.

(56) References Cited

U.S. PATENT DOCUMENTS

| | | | | |
|---|---|---|---|---|
| 2007/0018180 | A1* | 1/2007 | Lai | H01L 33/145 |
| | | | | 257/E33.068 |
| 2010/0237382 | A1* | 9/2010 | Kamei | H01L 33/20 |
| | | | | 257/E33.065 |
| 2011/0176301 | A1* | 7/2011 | Liang | H01L 25/0753 |
| | | | | 257/E33.059 |
| 2011/0315998 | A1* | 12/2011 | Hashimoto | H01L 29/2003 |
| | | | | 257/E29.089 |
| 2013/0140517 | A1* | 6/2013 | Tang | H01L 21/6836 |
| | | | | 257/9 |
| 2017/0200765 | A1 | 7/2017 | Choi et al. | |

FOREIGN PATENT DOCUMENTS

| | | |
|---|---|---|
| JP | 2011-139062 A | 7/2011 |
| JP | 2015-518265 A | 6/2015 |
| KR | 10-2006-0010331 A | 2/2006 |
| KR | 10-0735488 B1 | 7/2007 |
| KR | 10-2015-0146162 A | 12/2015 |
| KR | 10-1781505 B1 | 9/2017 |

* cited by examiner

DISPLAY DEVICE USING SEMICONDUCTOR LIGHT-EMITTING ELEMENTS, AND METHOD FOR MANUFACTURING SAME

CROSS REFERENCE TO RELATED APPLICATIONS

This application is the National Stage filing under 35 U.S.C. 371 of International Application No. PCT/KR2019/017154, filed on Dec. 6, 2019, which claims the benefit of earlier filing date and right of priority to U.S. Provisional Application No. 62/776,460, filed on Dec. 6, 2018, the entire contents of all these applications are all hereby expressly incorporated by reference into the present application.

BACKGROUND

1. Technical Field

The present disclosure relates to a display device and a method of manufacturing the same, and more particularly, to a display device using a semiconductor light-emitting element having a size of several μm to several tens of μm.

2. Description of the Related Art

In recent years, display devices having excellent characteristics such as low profile, flexibility and the like have been developed in the display technical field. On the contrary, currently commercialized main displays are represented by liquid crystal displays (LCDs) and active-matrix organic light-emitting diodes (AMOLEDs).

However, there exist problems such as not-so-fast response time, difficult implementation of flexibility in case of LCDs, and there exist drawbacks such as short life span, not-so-good yield as well as low flexibility in case of AMOLEDs.

On the other hand, light-emitting diodes (LEDs) are well known light-emitting devices for converting an electrical current to light, and have been used as a light source for displaying an image in an electronic device including information communication devices since red LEDs using GaAsP compound semiconductors were made commercially available in 1962, together with a GaP:N-based green LEDs. Accordingly, the semiconductor light-emitting elements may be used to implement a flexible display, thereby presenting a scheme for solving the problems.

The semiconductor light-emitting element is transferred onto a substrate in various ways. In order to transfer the semiconductor light-emitting element, the semiconductor light-emitting element formed on a growth substrate must be separated from the growth substrate. In the related art, a laser lift-off method has been used to separate semiconductor light-emitting element from the growth substrate. When using the laser lift-off method, a metal layer is disposed on a surface of the semiconductor light-emitting element separated from the growth substrate. The metal layer reduces the light efficiency of the semiconductor light-emitting element, and causes current leakage.

SUMMARY

An aspect of the present disclosure is to provide a manufacturing method capable of effectively removing a metal layer formed on a surface of a semiconductor light-emitting element by a laser lift-off method.

Another aspect of the present disclosure is to provide a manufacturing method and structure capable of insulating a surface of the semiconductor light-emitting element exposed to the outside by the laser lift off method.

In order to accomplish the foregoing objectives, the present disclosure may provide a display device, including a substrate having a wiring electrode, and a plurality of semiconductor light-emitting elements electrically connected to the wiring electrode, wherein the plurality of semiconductor light-emitting elements include a buffer layer, and a metal oxide layer formed on the buffer layer, and the metal oxide layer is made of an oxide of the buffer layer.

In an embodiment, the semiconductor light-emitting element may include a first conductive semiconductor layer formed on the wiring electrode, an active layer deposited on the first conductive semiconductor layer, a second conductive semiconductor layer deposited on the active layer, and a buffer layer deposited on the second conductive semiconductor layer.

In an embodiment, the metal oxide layer may be formed on a surface different from a surface in contact with the second conductive semiconductor layer between both surfaces of the buffer layer.

In an embodiment, the metal oxide layer may be made of any one of gallium oxide, silicon oxide, aluminum oxide, silicon carbide, and titanium oxide.

In an embodiment, the buffer layer may include a plurality of nanopores, and the nanopores may be formed on a surface in contact with the metal oxide layer between both surfaces of the buffer layer.

In an embodiment, the metal oxide layer may be formed on a surface of the buffer layer and an inner wall of the nanopores.

In an embodiment, a particle size of the nanopores may be 50 to 100 nm.

In an embodiment, the nanopores may be formed with a depth of 0.5 to 1 μm in a direction from the surface of the buffer layer toward the second conductive semiconductor layer.

In an embodiment, the display device may further include a light-transmitting layer disposed to cover the metal oxide layer, wherein a refractive index of the metal oxide layer is between those of the light-transmitting layer and the second conductive semiconductor layer.

In addition, the present disclosure may provide a method of manufacturing a display device, and the method may include forming a plurality of semiconductor light-emitting elements on a growth substrate, forming a passivation layer on the semiconductor light-emitting element, bonding the growth substrate to a temporary substrate, separating the semiconductor light-emitting elements from the growth substrate using a laser lift-off method, and oxidizing a surface of the semiconductor light-emitting element, wherein the semiconductor light-emitting element separated from the growth substrate has a buffer layer, and said oxidizing the surface of the semiconductor light-emitting elements oxidizes a surface of the buffer layer.

According to the present disclosure, a metal layer formed on a surface of the semiconductor light-emitting element may be oxidized by a laser lift-off method, thereby removing the metal layer without exposing the semiconductor light-emitting element to an acid or a base.

Furthermore, according to the present disclosure, a metal layer formed on a surface of the semiconductor light-emitting element may be oxidized by a laser lift-off method, thereby insulating the surface of the semiconductor light-emitting element exposed to the outside by the laser lift-off method without adding a process of forming an additional insulating layer.

DETAILED DESCRIPTION OF THE EMBODIMENTS

Figure 1:
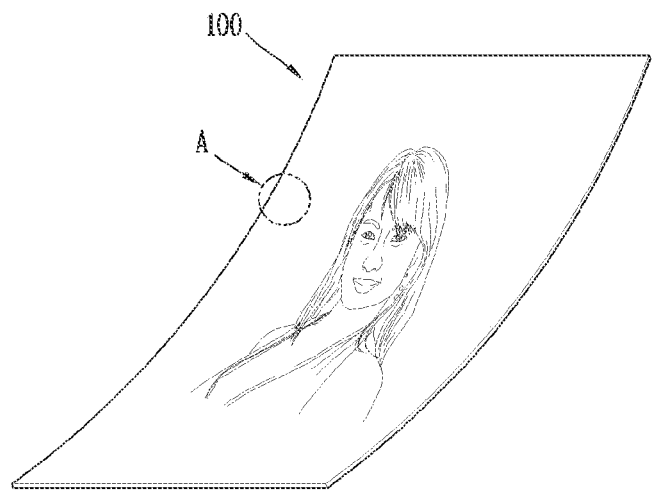
FIG. 1 is a conceptual view showing a display device using a semiconductor light-emitting element according to an embodiment of the present disclosure.

Hereinafter, the embodiments disclosed herein will be described in detail with reference to the accompanying drawings, and the same or similar elements are designated with the same numeral references regardless of the numerals in the drawings and their redundant description will be omitted. A suffix "module" and "unit" used for constituent elements disclosed in the following description is merely intended for easy description of the specification, and the suffix itself does not give any special meaning or function. In describing an embodiment disclosed herein, moreover, the detailed description will be omitted when specific description for publicly known technologies to which the invention pertains is judged to obscure the gist of the present disclosure. Also, it should be noted that the accompanying drawings are merely illustrated to easily explain the concept of the invention, and therefore, they should not be construed to limit the technological concept disclosed herein by the accompanying drawings.

Furthermore, it will be understood that when an element such as a layer, region or substrate is referred to as being "on" another element, it can be directly on the another element or an intermediate element may also be interposed therebetween.

A display device disclosed herein may include a portable phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, it would be easily understood by those skilled in the art that a configuration disclosed herein may be applicable to any displayable device even though it is a new product type which will be developed later.

FIG. 1 is a conceptual view showing a display device using a semiconductor light-emitting element according to an embodiment of the present disclosure.

According to the drawing, information processed in the controller of the display device 100 may be displayed using a flexible display.

The flexible display may include a flexible, bendable, twistable, foldable and rollable display. For example, the flexible display may be a display manufactured on a thin and flexible substrate that can be warped, bent, folded or rolled like a paper sheet while maintaining the display characteristics of a flat display in the related art.

A display area of the flexible display becomes a plane in a configuration that the flexible display is not warped (for example, a configuration having an infinite radius of curvature, hereinafter, referred to as a "first configuration"). The display area thereof becomes a curved surface in a configuration that the flexible display is warped by an external force in the first configuration (for example, a configuration having a finite radius of curvature, hereinafter, referred to as a "second configuration"). As illustrated, information displayed in the second configuration may be visual information displayed on a curved surface. The visual information may be implemented by individually controlling the light emission of sub-pixels disposed in a matrix form. The sub-pixel denotes a minimum unit for implementing one color.

The sub-pixel of the flexible display may be implemented by a semiconductor light-emitting element. According to the present disclosure, a light-emitting diode (LED) is illustrated as a type of semiconductor light-emitting element. The light-emitting diode may be formed with a small size to perform the role of a sub-pixel even in the second configuration through this.

Hereinafter, a flexible display implemented using the light-emitting diode will be described in more detail with reference to the accompanying drawings.

Figure 2:
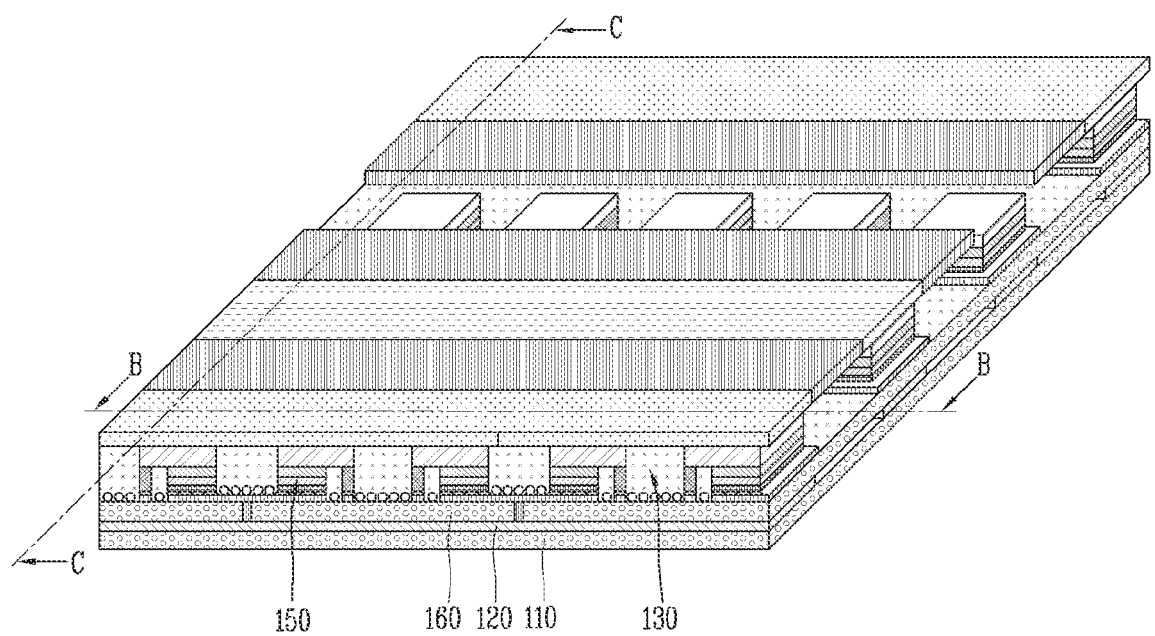
FIG. 2 is a partial enlarged view of portion "A" in FIG. 1, and FIGS. 3A and 3B are cross-sectional views taken along lines B-B and C-C in FIG. 2.
Figure 3A:
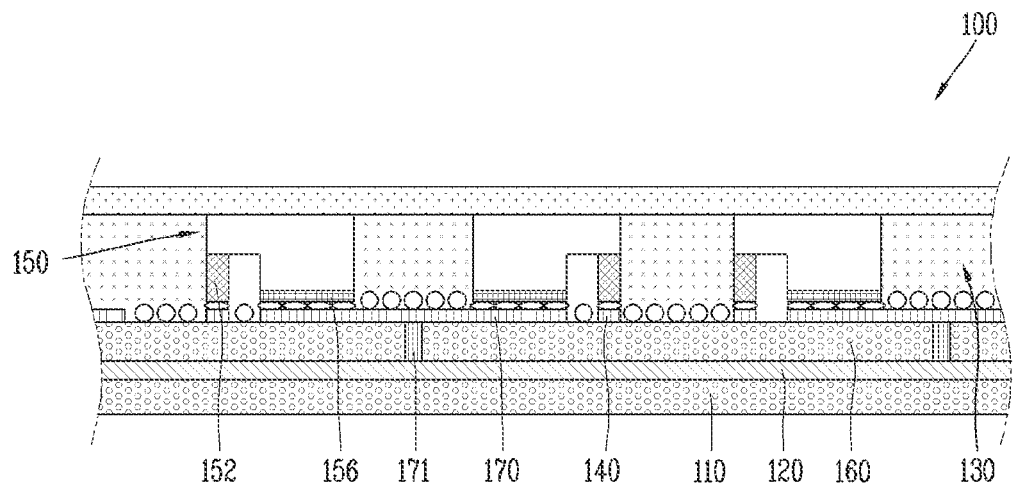
Figure 3B:
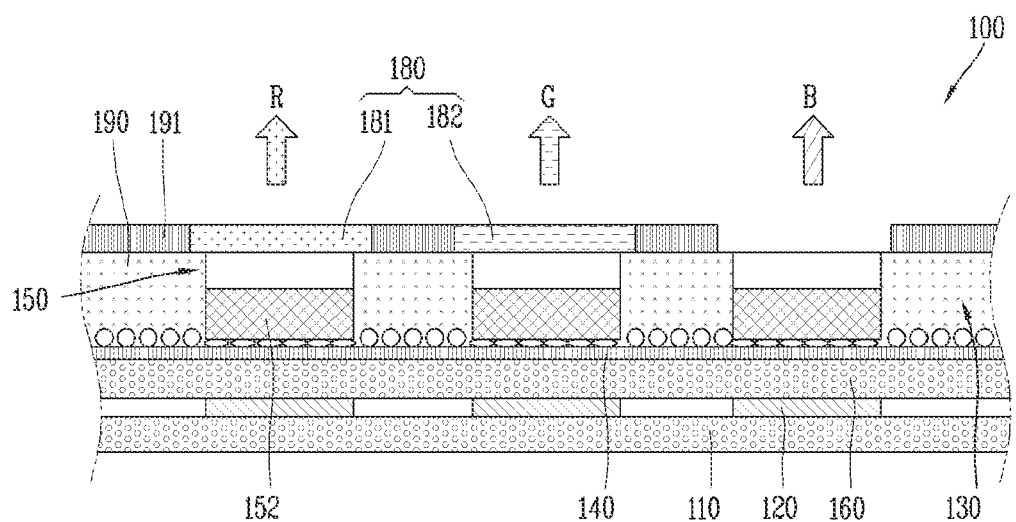
Figure 4:
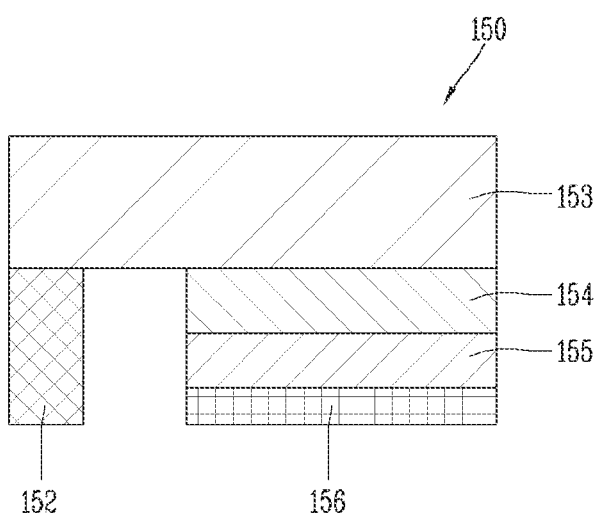
FIG. 4 is a conceptual view showing a flip-chip type semiconductor light-emitting element in FIG. 3A.

FIG. 2 is a partial enlarged view of portion "A" in FIG. 1, and FIGS. 3A and 3B are cross-sectional views taken along lines B-B and C-C in FIG. 2, FIG. 4 is a conceptual view illustrating a flip-chip type semiconductor light-emitting element in FIG. 3A, and FIGS. 5A through 5C are conceptual views illustrating various forms for implementing colors in connection with a flip-chip type semiconductor light-emitting element.

According to the drawings in FIGS. 2, 3A and 3B, there is illustrated a display device 100 using a passive matrix (PM) type semiconductor light-emitting element as a display device 100 using a semiconductor light-emitting element. However, an example described below may also be applicable to an active-matrix (AM) type semiconductor light-emitting element.

The display device 100 may include a substrate 110, a first electrode 120, a conductive adhesive layer 130, a second electrode 140, and a plurality of semiconductor light-emitting elements 150.

The substrate 110 may be a flexible substrate. The substrate 110 may contain glass or polyimide (PI) to implement the flexible display device. In addition, if it is an insulating and flexible material, any one such as polyethylene naphthalate (PEN), polyethylene terephthalate (PET) or the like may be used. Furthermore, the substrate 110 may be either one of transparent and non-transparent materials.

The substrate 110 may be a wiring substrate disposed with the first electrode 120, and thus the first electrode 120 may be placed on the substrate 110.

According to the drawing, an insulating layer 160 may be disposed on the substrate 110 placed with the first electrode 120, and an auxiliary electrode 170 may be placed on the insulating layer 160. In this case, a state in which the insulating layer 160 is deposited on the substrate 110 may be a single wiring substrate. More specifically, the insulating layer 160 made of an insulating and flexible material such as polyimide (PI), PET, PEN or the like may be integrally formed with the substrate 110 to form a single wiring substrate.

The auxiliary electrode 170 as an electrode for electrically connecting the first electrode 120 to the semiconductor light-emitting element 150 is placed on the insulating layer 160, and disposed to correspond to the location of the first electrode 120. For example, the auxiliary electrode 170 has a dot shape, and may be electrically connected to the first electrode 120 by means of an electrode hole 171 passing through the insulating layer 160. The electrode hole 171 may be formed by filling a conductive material in via a hole.

Referring to the drawings, the conductive adhesive layer 130 may be formed on one surface of the insulating layer 160, but the present disclosure may not be necessarily limited to this. For example, it may be possible to also have a structure in which the conductive adhesive layer 130 is disposed on the substrate 110 with no insulating layer 160. The conductive adhesive layer 130 may perform the role of an insulating layer in the structure in which the conductive adhesive layer 130 is disposed on the substrate 110.

The conductive adhesive layer 130 may be a layer having adhesiveness and conductivity, and to this end, a conductive material and an adhesive material may be mixed on the conductive adhesive layer 130. Furthermore, the conductive adhesive layer 130 may have flexibility, thereby allowing a flexible function in the display device.

For such an example, the conductive adhesive layer 130 may be an anisotropic conductive film (ACF), an anisotropic conductive paste, a solution containing conductive particles, and the like. The conductive adhesive layer 130 may allow electrical interconnection in the z-direction passing through the thickness thereof, but may be configured as a layer having electrical insulation in the horizontal x-y direction thereof. Accordingly, the conductive adhesive layer 130 may be referred to as a z-axis conductive layer (however, hereinafter referred to as a "conductive adhesive layer").

The anisotropic conductive film is a film with a form in which an anisotropic conductive medium is mixed with an insulating base member, and thus when heat and pressure are applied thereto, only a specific portion thereof may have conductivity by means of the anisotropic conductive medium. Hereinafter, heat and pressure are applied to the anisotropic conductive film, but other methods may be also available for the anisotropic conductive film to partially have conductivity. The methods may include applying only either one of heat and pressure thereto, UV curing, and the like.

Furthermore, the anisotropic conductive medium may be conductive balls or particles. According to the drawing, in the present example, the anisotropic conductive film is a film with a form in which an anisotropic conductive medium is mixed with an insulating base member, and thus when heat and pressure are applied thereto, only a specific portion thereof may have conductivity by means of the conductive balls. The anisotropic conductive film may be in a state in which a core with a conductive material contains a plurality of particles coated by an insulating layer with a polymer material, and in this case, it may have conductivity by means of the core while breaking an insulating layer on a portion to which heat and pressure are applied. Here, a core may be transformed to implement a layer having both surfaces to which objects contact in the thickness direction of the film. For a more specific example, heat and pressure are applied to an anisotropic conductive film as a whole, and electrical connection in the z-axis direction is partially formed by a height difference from a mating object adhered by the use of the anisotropic conductive film.

For another example, an anisotropic conductive film may be in a state containing a plurality of particles in which a conductive material is coated on insulating cores. In this case, a portion to which heat and pressure are applied may be converted (pressed and adhered) to a conductive material to have conductivity in the thickness direction of the film. For still another example, it may be formed to have conductivity in the thickness direction of the film in which a conductive material passes through an insulating base member in the z-direction. In this case, the conductive material may have a pointed end portion.

According to the drawing, the anisotropic conductive film may be a fixed array anisotropic conductive film (ACF) configured with a form in which conductive balls are inserted into one surface of the insulating base member. More specifically, the insulating base member is formed of an adhesive material, and the conductive balls are intensively disposed at a bottom portion of the insulating base member, and when heat and pressure are applied thereto, the base member is modified along with the conductive balls, thereby having conductivity in the vertical direction thereof.

However, the present disclosure may not be necessarily limited to this, and the anisotropic conductive film may be all allowed to have a form in which conductive balls are randomly mixed with an insulating base member or a form configured with a plurality of layers in which conductive balls are disposed at any one layer (double-ACF), and the like.

The anisotropic conductive paste as a form coupled to a paste and conductive balls may be a paste in which conductive balls are mixed with an insulating and adhesive base material. Furthermore, a solution containing conductive particles may be a solution in a form containing conductive particles or nano particles.

Referring again to the drawing, the second electrode 140 is located at the insulating layer 160 to be separated from the auxiliary electrode 170. In other words, the conductive adhesive layer 130 is disposed on the insulating layer 160 located with the auxiliary electrode 170 and second electrode 140.

When the conductive adhesive layer 130 is formed in a state that the auxiliary electrode 170 and second electrode 140 are located on the insulating layer 160, and then the semiconductor light-emitting element 150 is connect thereto in a flip chip form with the application of heat and pressure, the semiconductor light-emitting element 150 is electrically connected to the first electrode 120 and second electrode 140.

Referring to FIG. 4, the semiconductor light-emitting element may be a flip chip type semiconductor light-emitting element.

For example, the semiconductor light-emitting element may include a p-type electrode 156, a p-type semiconductor layer 155 formed with the p-type electrode 156, an active layer 154 formed on the p-type semiconductor layer 155, an n-type semiconductor layer 153 formed on the active layer 154, and an n-type electrode 152 disposed to be separated from the p-type electrode 156 in the horizontal direction on the n-type semiconductor layer 153. In this case, the p-type electrode 156 may be electrically connected to the welding portion 179 by the conductive adhesive layer 130, and the n-type electrode 152 may be electrically connected to the second electrode 140.

Referring to FIGS. 2, 3A and 3B again, the auxiliary electrode 170 may be formed in an elongated manner in one direction to be electrically connected to a plurality of semiconductor light-emitting elements 150. For example, the left and right p-type electrodes of the semiconductor light-emitting elements around the auxiliary electrode may be electrically connected to one auxiliary electrode.

More specifically, the semiconductor light-emitting element 150 is pressed into the conductive adhesive layer 130, and through this, only a portion between the p-type electrode 156 and auxiliary electrode 170 of the semiconductor light-emitting element 150 and a portion between the n-type electrode 152 and second electrode 140 of the semiconductor light-emitting element 150 have conductivity, and the remaining portion does not have conductivity since there is no push-down of the semiconductor light-emitting element. As described above, the conductive adhesive layer 130 may form an electrical connection as well as allow a mutual coupling between the semiconductor light-emitting element 150 and the auxiliary electrode 170 and between the semiconductor light-emitting element 150 and the second electrode 140.

Furthermore, a plurality of semiconductor light-emitting elements 150 constitute a light-emitting array, and a phosphor layer 180 is formed on the light-emitting array.

The light-emitting device array may include a plurality of semiconductor light-emitting elements with different self-luminance values. Each of the semiconductor light-emitting elements 150 constitutes a sub-pixel, and is electrically connected to the first electrode 120. For example, there may exist a plurality of first electrodes 120, and the semiconductor light-emitting elements are arranged in several rows, for instance, and each row of the semiconductor light-emitting elements may be electrically connected to any one of the plurality of first electrodes.

Furthermore, the semiconductor light-emitting elements may be connected in a flip chip form, and thus semiconductor light-emitting elements grown on a transparent dielectric substrate. Furthermore, the semiconductor light-emitting elements may be nitride semiconductor light-emitting elements, for instance. The semiconductor light-emitting element 150 may have excellent luminance characteristics, and thus it may be possible to configure individual unit pixels even with a small size thereof.

According to the drawing, a partition wall 190 may be formed between the semiconductor light-emitting elements 150. In this case, the partition wall 190 may perform the role of dividing individual sub-pixels from one another, and be formed as an integral body with the conductive adhesive layer 130. For example, a base member of the anisotropic conductive film may form the partition wall when the semiconductor light-emitting element 150 is inserted into the anisotropic conductive film.

Furthermore, when the base member of the anisotropic conductive film is black, the partition wall 190 may have reflective characteristics while at the same time increasing contrast with no additional black insulator.

For another example, a reflective partition wall may be separately provided with the partition wall 190. In this case, the partition wall 190 may include a black or white insulator according to the purpose of the display device. When a partition wall of a white insulator is used, an effect of enhancing reflectivity may be obtained. When a partition wall of a black insulator is used, a contrast ratio may be increased while having a reflection characteristic.

The phosphor layer 180 may be located at an outer surface of the semiconductor light-emitting element 150. For example, the semiconductor light-emitting element 150 is a blue semiconductor light-emitting element that emits blue (B) light, and the phosphor layer 180 performs a function of converting the blue (B) light into the color of a sub-pixel. The phosphor layer 180 may be a red phosphor layer 181 or green phosphor layer 182 constituting individual pixels.

In other words, a red phosphor 181 capable of converting blue light into red (R) light may be deposited on the blue semiconductor light-emitting element 151 at a position implementing a red sub-pixel, and a green phosphor 182 capable of converting blue light into green (G) light may be deposited on the blue semiconductor light-emitting element 151 at a position implementing a green sub-pixel. Furthermore, only the blue semiconductor light-emitting element 151 may be solely used at a location implementing a blue sub-pixel. In this case, the red (R), green (G) and blue (B) sub-pixels may implement one pixel. More specifically, one color phosphor may be deposited along each line of the first electrode 120. Accordingly, one line on the first electrode 120 may be an electrode controlling one color. In other words, red (R), green (B) and blue (B) may be sequentially disposed along the second electrode 140, thereby implementing sub-pixels.

However, the present disclosure may not be necessarily limited to this, and the semiconductor light-emitting element 150 may be combined with quantum dot (QD) instead of phosphor to implement sub-pixels such as red (R), green (G) and blue (B).

Furthermore, a black matrix 191 may be disposed between each phosphor layer to enhance contrast. In other words, the black matrix 191 can enhance the contrast of luminance.

However, the present disclosure may not be necessarily limited to this, and another structure for implementing blue, red and green may be also applicable thereto.

Figure 5A:
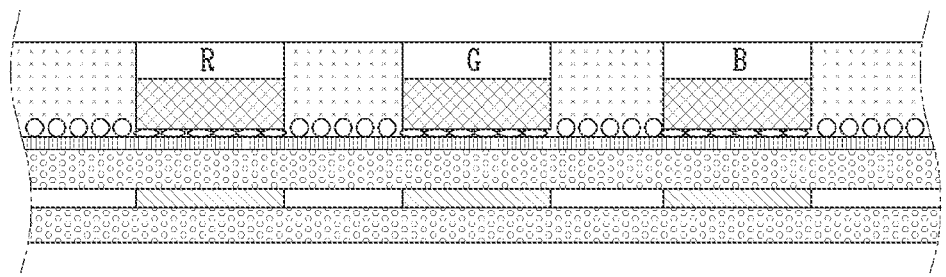
FIGS. 5A through 5C are conceptual views showing various forms for implementing colors in connection with a flip-chip type semiconductor light-emitting element.

Referring to FIG. 5A, each of the semiconductor light-emitting elements 150 may be implemented with a high-power light-emitting device that emits various lights including blue in which gallium nitride (GaN) is mostly used, and indium (In) and or aluminum (Al) are added thereto.

In this case, the semiconductor light-emitting element 150 may be red, green and blue semiconductor light-emitting elements, respectively, to implement each sub-pixel. For instance, red, green and blue semiconductor light-emitting elements (R, G, B) are alternately disposed, and red, green and blue sub-pixels implement one pixel by means of the red, green and blue semiconductor light-emitting elements, thereby implementing a full color display.

Figure 5B:
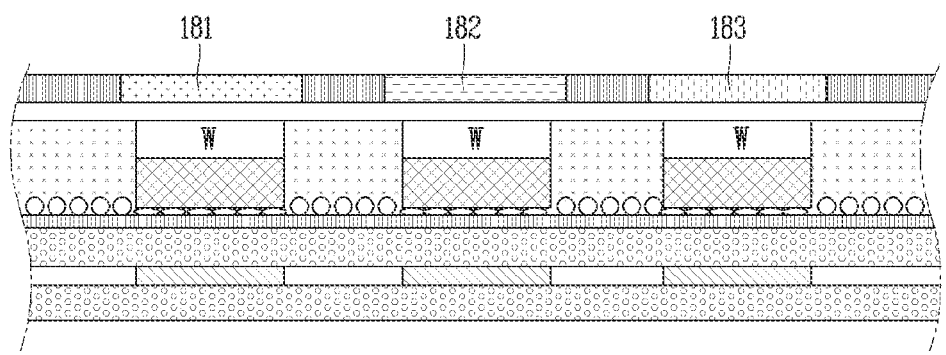

Referring to FIG. 5B, the semiconductor light-emitting element may have a white light-emitting device (W) provided with a yellow phosphor layer for each element. In this case, a red phosphor layer 181, a green phosphor layer 182 and blue phosphor layer 183 may be provided on the white light-emitting device (W) to implement a sub-pixel. Furthermore, a color filter repeated with red, green and blue on the white light-emitting device (W) may be used to implement a sub-pixel.

Figure 5C:
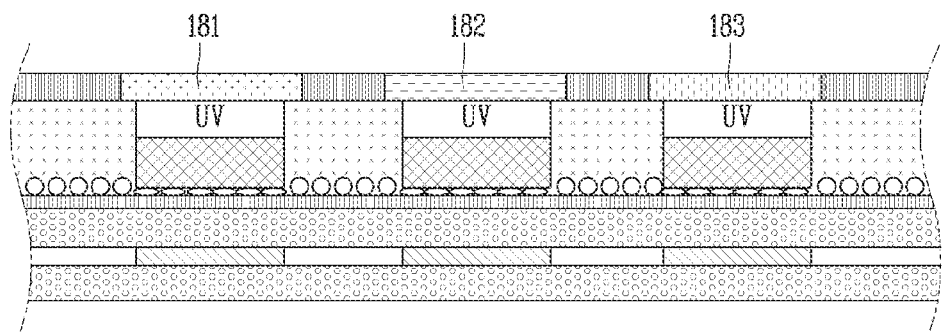

Referring to FIG. 5C, it may be possible to also have a structure in which a red phosphor layer 181, a green phosphor layer 182 and blue phosphor layer 183 may be provided on a ultra violet light-emitting device (UV). In this manner, the semiconductor light-emitting element can be used over the entire region up to ultra violet (UV) as well as visible light, and may be extended to a form of semiconductor light-emitting element in which ultra violet (UV) can be used as an excitation source.

Taking the present example into consideration again, the semiconductor light-emitting element 150 is placed on the conductive adhesive layer 130 to constitute a sub-pixel in the display device. The semiconductor light-emitting element 150 may have excellent luminance characteristics, and thus it may be possible to configure individual sub-pixels even with a small size thereof. The size of the individual semiconductor light-emitting element 150 may be less than 80 μm in the length of one side thereof, and formed with a rectangular or square shaped element. In case of a rectangular shaped element, the size thereof may be less than 20×80 μm.

Furthermore, even when a square shaped semiconductor light-emitting element 150 with a length of side of 10 μm is used for a sub-pixel, it will exhibit a sufficient brightness for implementing a display device. Accordingly, for example, in case of a rectangular pixel in which one side of a sub-pixel is 600 μm in size, and the remaining one side thereof is 300 μm, a relative distance between the semiconductor light-emitting elements becomes sufficiently large. Accordingly, in this case, it may be possible to implement a flexible display device having a HD image quality.

A display device using the foregoing semiconductor light-emitting element will be manufactured by a new type of manufacturing method. Hereinafter, the manufacturing method will be described with reference to FIG. 6.

Figure 6:
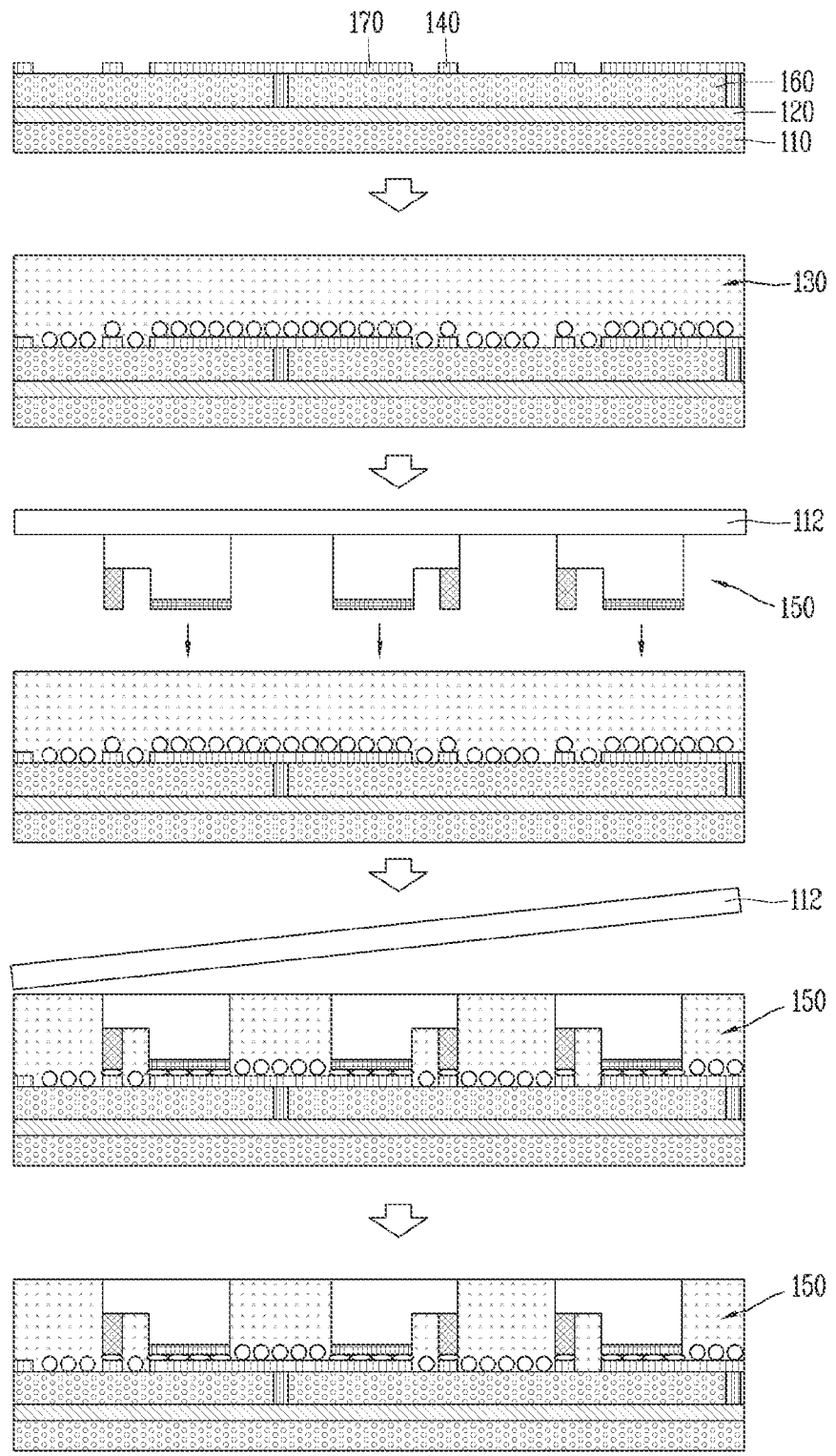
FIG. 6 is cross-sectional views showing a manufacturing method of a display device using a semiconductor light-emitting element according to the present disclosure.

FIG. 6 is cross-sectional views illustrating a manufacturing method of a display device using a semiconductor light-emitting element according to the present disclosure.

Referring to the drawing, first, the conductive adhesive layer 130 is formed on the insulating layer 160 located with the auxiliary electrode 170 and second electrode 140. The insulating layer 160 is deposited on the first substrate 110 to form one substrate (or wiring substrate), and the first electrode 120, auxiliary electrode 170 and second electrode 140 are disposed at the wiring substrate. In this case, the first electrode 120 and second electrode 140 may be disposed in a perpendicular direction to each other. Furthermore, the first substrate 110 and insulating layer 160 may contain glass or polyimide (PI), respectively, to implement a flexible display device.

The conductive adhesive layer 130 may be implemented by an anisotropic conductive film, for example, and to this end, an anisotropic conductive film may be coated on a substrate located with the insulating layer 160.

Next, a second substrate 112 located with a plurality of semiconductor light-emitting elements 150 corresponding to the location of the auxiliary electrodes 170 and second electrodes 140 and constituting individual pixels is disposed such that the semiconductor light-emitting element 150 faces the auxiliary electrode 170 and second electrode 140.

In this case, the second substrate 112 as a growth substrate for growing the semiconductor light-emitting element 150 may be a sapphire substrate or silicon substrate.

The semiconductor light-emitting element may have a gap and size capable of implementing a display device when formed in the unit of wafer, and thus effectively used for a display device.

Next, the wiring substrate is thermally compressed to the second substrate 112. For example, the wiring substrate and second substrate 112 may be thermally compressed to each other by applying an ACF press head. The wiring substrate and second substrate 112 are bonded to each other using the thermal compression. Only a portion between the semiconductor light-emitting element 150 and the auxiliary electrode 170 and second electrode 140 may have conductivity due to the characteristics of an anisotropic conductive film having conductivity by thermal compression, thereby allowing the electrodes and semiconductor light-emitting element 150 to be electrically connected to each other. At this time, the semiconductor light-emitting element 150 may be inserted into the anisotropic conductive film, thereby forming a partition wall between the semiconductor light-emitting elements 150.

Next, the second substrate 112 is removed. For example, the second substrate 112 may be removed using a laser lift-off (LLO) or chemical lift-off (CLO) method.

Finally, the second substrate 112 is removed to expose the semiconductor light-emitting elements 150 to the outside. Silicon oxide (SiOx) or the like may be coated on the wiring substrate coupled to the semiconductor light-emitting element 150 to form a transparent insulating layer (not shown).

Furthermore, it may further include the process of forming a phosphor layer on one surface of the semiconductor light-emitting element 150. For example, the semiconductor light-emitting element 150 may be a blue semiconductor light-emitting element for emitting blue (B) light, and red or green phosphor for converting the blue (B) light into the color of the sub-pixel may form a layer on one surface of the blue semiconductor light-emitting element.

The manufacturing method or structure of a display device using the foregoing semiconductor light-emitting element may be modified in various forms. For such an example, the foregoing display device may be applicable to a vertical semiconductor light-emitting element. Hereinafter, the vertical structure will be described with reference to FIGS. 5 and 6.

Furthermore, according to the following modified example or embodiment, the same or similar reference numerals are designated to the same or similar configurations to the foregoing example, and the description thereof will be substituted by the earlier description.

Figure 7:
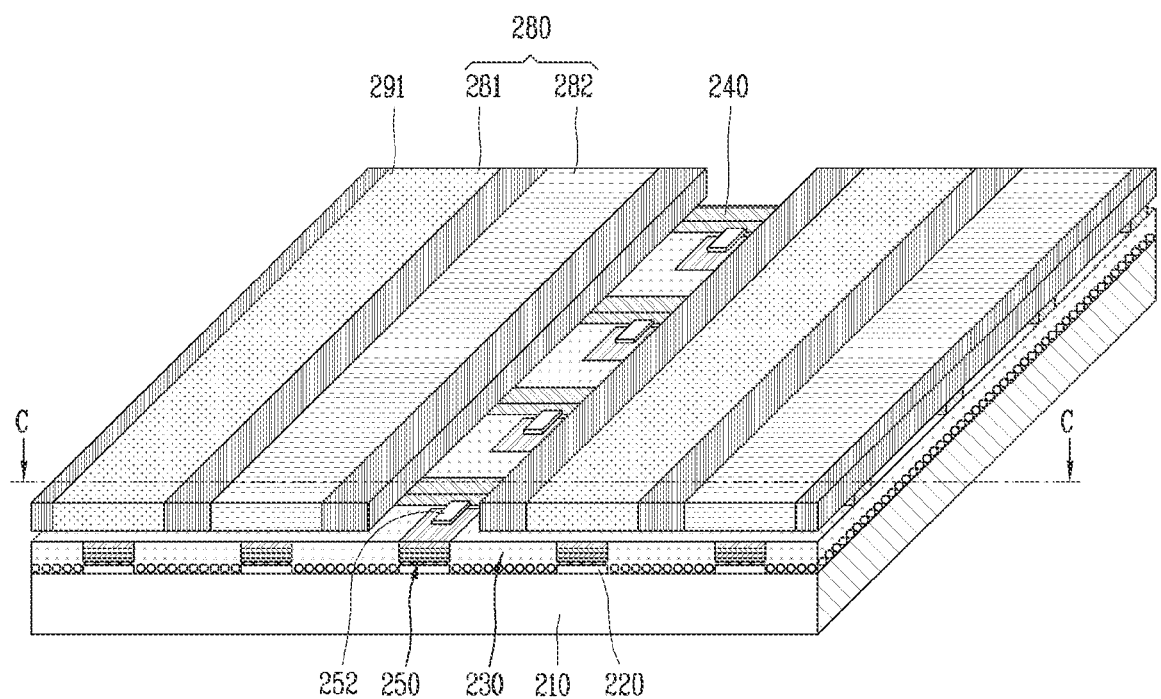
FIG. 7 is a perspective view showing a display device using a semiconductor light-emitting element according to another embodiment of the present disclosure.
Figure 8:
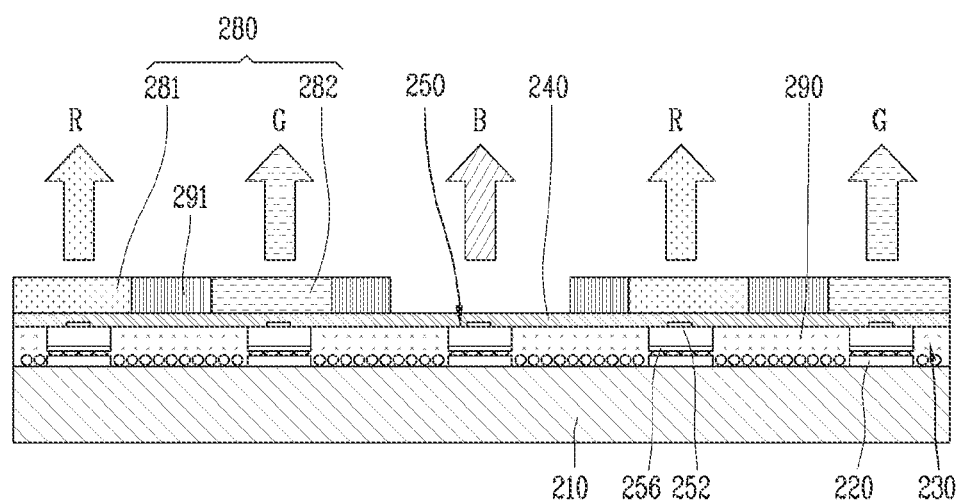
FIG. 8 is a cross-sectional view taken along line C-C in FIG. 7.
Figure 9:
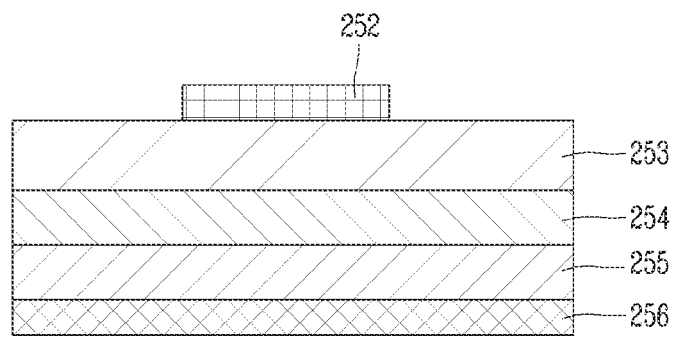
FIG. 9 is a conceptual view showing a vertical semiconductor light-emitting element in FIG. 8.

FIG. 7 is a perspective view illustrating a display device using a semiconductor light-emitting element according to another embodiment of the present disclosure. FIG. 8 is a cross-sectional view taken along line C-C in FIG. 7, and FIG. 9 is a conceptual view illustrating a vertical type semiconductor light-emitting element in FIG. 8.

According to the drawings, the display device may be display device using a passive matrix (PM) type of vertical semiconductor light-emitting element.

The display device may include a substrate 210, a first electrode 220, a conductive adhesive layer 230, a second electrode 240 and a plurality of semiconductor light-emitting elements 250.

The substrate 210 as a wiring substrate disposed with the first electrode 220 may include polyimide (PI) to implement a flexible display device. In addition, any one may be used if it is an insulating and flexible material.

The first electrode 220 may be located on the substrate 210, and formed with a bar-shaped electrode elongated in one direction. The first electrode 220 may be formed to perform the role of a data electrode.

The conductive adhesive layer 230 is formed on the substrate 210 located with the first electrode 220. Similar to a display device to which a flip chip type light-emitting device is applied, the conductive adhesive layer 230 may be an anisotropic conductive film (ACF), an anisotropic conductive paste, a solution containing conductive particles, and the like. However, the present embodiment also illustrates a case where the conductive adhesive layer 230 is implemented by an anisotropic conductive film.

When an anisotropic conductive film is located in a state that the first electrode 220 is located on the substrate 210, and then heat and pressure are applied to connect the semiconductor light-emitting element 250 thereto, the semiconductor light-emitting element 250 is electrically connected to the first electrode 220. At this time, the semiconductor light-emitting element 250 may be preferably disposed on the first electrode 220.

The electrical connection is generated because an anisotropic conductive film partially has conductivity in the thickness direction when heat and pressure are applied as described above. Accordingly, the anisotropic conductive film is partitioned into a portion having conductivity and a portion having no conductivity in the thickness direction thereof.

Furthermore, the anisotropic conductive film contains an adhesive component, and thus the conductive adhesive layer 230 implements a mechanical coupling as well as an electrical coupling between the semiconductor light-emitting element 250 and the first electrode 220.

In this manner, the semiconductor light-emitting element 250 is placed on the conductive adhesive layer 230, thereby configuring a separate sub-pixel in the display device. The semiconductor light-emitting element 250 may have excellent luminance characteristics, and thus it may be possible to configure individual unit pixels even with a small size thereof. The size of the individual semiconductor light-emitting element 250 may be less than 80 μm in the length of one side thereof, and formed with a rectangular or square shaped element. In case of a rectangular shaped element, the size thereof may be less than 20×80 μm.

The semiconductor light-emitting element 250 may be a vertical structure.

A plurality of second electrodes 240 disposed in a direction of crossing the length direction of the first electrode 220, and electrically connected to the vertical semiconductor light-emitting element 250 may be located between vertical semiconductor light-emitting elements.

Referring to FIG. 9, the vertical semiconductor light-emitting element may include a p-type electrode 256, a p-type semiconductor layer 255 formed with the p-type electrode 256, an active layer 254 formed on the p-type semiconductor layer 255, an n-type semiconductor layer 253 formed on the active layer 254, and an n-type electrode 252 formed on the n-type semiconductor layer 253. In this case, the p-type electrode 256 located at the bottom thereof may be electrically connected to the first electrode 220 by the conductive adhesive layer 230, and the n-type electrode 252 located at the top thereof may be electrically connected to the second electrode 240 which will be described later. The electrodes may be disposed in the upward/downward direction in the vertical semiconductor light-emitting element 250, thereby providing a great advantage capable of reducing the chip size.

Referring again to FIG. 8, a phosphor layer 280 may be formed on one surface of the semiconductor light-emitting element 250. For example, the semiconductor light-emitting element 250 is a blue semiconductor light-emitting element 251 that emits blue (B) light, and the phosphor layer 280 for converting the blue (B) light into the color of the sub-pixel may be provided thereon. In this case, the phosphor layer 280 may be a red phosphor 281 and a green phosphor 282 constituting individual pixels.

In other words, a red phosphor 281 capable of converting blue light into red (R) light may be deposited on the blue semiconductor light-emitting element 251 at a position implementing a red sub-pixel, and a green phosphor 282 capable of converting blue light into green (G) light may be deposited on the blue semiconductor light-emitting element 251 at a position implementing a green sub-pixel. Furthermore, only the blue semiconductor light-emitting element 251 may be solely used at a location implementing a blue sub-pixel. In this case, the red (R), green (G) and blue (B) sub-pixels may implement one pixel.

However, the present disclosure may not be necessarily limited to this, and another structure for implementing blue, red and green may be also applicable thereto as described above in a display device to which a flip chip type light-emitting device is applied.

Taking the present embodiment into consideration again, the second electrode 240 is located between the semiconductor light-emitting elements 250, and electrically connected to the semiconductor light-emitting elements 250. For example, the semiconductor light-emitting elements 250 may be disposed in a plurality of rows, and the second electrode 240 may be located between the rows of the semiconductor light-emitting elements 250.

Since a distance between the semiconductor light-emitting elements 250 constituting individual pixels is sufficiently large, the second electrode 240 may be located between the semiconductor light-emitting elements 250.

The second electrode 240 may be formed with a bar-shaped electrode elongated in one direction, and disposed in a perpendicular direction to the first electrode.

Furthermore, the second electrode 240 may be electrically connected to the semiconductor light-emitting element 250 by a connecting electrode protruded from the second electrode 240. More specifically, the connecting electrode may be an n-type electrode of the semiconductor light-emitting element 250. For example, the n-type electrode is formed with an ohmic electrode for ohmic contact, and the second electrode covers at least part of the ohmic electrode by printing or deposition. Through this, the second electrode 240 may be electrically connected to the n-type electrode of the semiconductor light-emitting element 250.

According to the drawing, the second electrode 240 may be located on the conductive adhesive layer 230. According to circumstances, a transparent insulating layer (not shown) containing silicon oxide (SiOx) may be formed on the substrate 210 formed with the semiconductor light-emitting element 250. When the transparent insulating layer is formed and then the second electrode 240 is placed thereon, the second electrode 240 may be located on the transparent insulating layer. Furthermore, the second electrode 240 may be formed to be separated from the conductive adhesive layer 230 or transparent insulating layer.

If a transparent electrode such as indium tin oxide (ITO) is used to locate the second electrode 240 on the semiconductor light-emitting element 250, the ITO material has a problem of bad adhesiveness with an n-type semiconductor. Accordingly, the second electrode 240 may be placed between the semiconductor light-emitting elements 250, thereby obtaining an advantage in which the transparent electrode is not required. Accordingly, an n-type semiconductor layer and a conductive material having a good adhesiveness may be used as a horizontal electrode without being restricted by the selection of a transparent material, thereby enhancing the light extraction efficiency.

According to the drawing, a partition wall 290 may be formed between the semiconductor light-emitting elements 250. In other words, the partition wall 290 may be disposed between the vertical semiconductor light-emitting elements 250 to isolate the semiconductor light-emitting element 250 constituting individual pixels. In this case, the partition wall 290 may perform the role of dividing individual sub-pixels from one another, and be formed as an integral body with the conductive adhesive layer 230. For example, a base member of the anisotropic conductive film may form the partition wall when the semiconductor light-emitting element 250 is inserted into the anisotropic conductive film.

Furthermore, when the base member of the anisotropic conductive film is black, the partition wall 290 may have reflective characteristics while at the same time increasing contrast with no additional black insulator.

For another example, a reflective partition wall may be separately provided with the partition wall 290. In this case, the partition wall 290 may include a black or white insulator according to the purpose of the display device.

If the second electrode 240 is precisely located on the conductive adhesive layer 230 between the semiconductor light-emitting elements 250, the partition wall 290 may be located between the semiconductor light-emitting element 250 and second electrode 240. Accordingly, individual unit pixels may be configured even with a small size using the semiconductor light-emitting element 250, and a distance between the semiconductor light-emitting elements 250 may be relatively sufficiently large to place the second electrode 240 between the semiconductor light-emitting elements 250, thereby having the effect of implementing a flexible display device having a HD image quality.

Furthermore, according to the drawing, a black matrix 291 may be disposed between each phosphor layer to enhance contrast. In other words, the black matrix 291 can enhance the contrast of luminance.

As described above, the semiconductor light-emitting element 250 is located on the conductive adhesive layer 230, thereby constituting individual pixels on the display device. The semiconductor light-emitting element 250 may have excellent luminance characteristics, and thus it may be possible to configure individual unit pixels even with a small size thereof. As a result, it may be possible to implement a full color display in which the sub-pixels of red (R), green (G) and blue (B) implement one pixel by means of the semiconductor light-emitting element.

On the other hand, when manufacturing a display device according to the present disclosure, a process of separating the semiconductor light-emitting element from the growth substrate is performed. In the related art, the semiconductor light-emitting element has been separated from the growth substrate through a laser lift-off method.

Specifically, a laser lift-off process of attaching a sapphire substrate on which the formation of a blue semiconductor light-emitting element is completed to a primary donor substrate, and then irradiating a 248-nm or 266-nm excimer laser on the sapphire substrate surface for each semiconductor light-emitting element isolated in a small size to separate a GaN layer between a buffer layer and the sapphire ($Al_2O_3$) layer is carried out.

At this time, Ga metal remains at a GaN interface, and a process of removing the Ga metal using an acid or a base is additionally performed since the metal layer inhibits the light transmittance of the semiconductor light-emitting element.

When manufacturing a flexible surface light source, the surface light source is manufactured by attaching a small LED chip to a flexible organic material, and thus a laser lift process and a coating or deposition process of an insulating protective layer for an n-GaN or undoped GaN material exposed after removing residual Ga does not exist. Due to this problem, the efficiency deterioration and defect of the blue semiconductor light-emitting element, which is an inorganic material, occurs in a high temperature and high humidity environment.

Meanwhile, it is difficult to deposit an inorganic insulating layer of high-temperature vapor deposition on a surface of n-GaN or undoped GaN exposed to the outside in a structure in which organic materials are mixed. The present disclosure provides a structure including an insulating layer capable of protecting n-GaN or undoped GaN exposed to the outside during a laser lift-off process and a method of generating an insulating layer.

First, a method of manufacturing a display device according to the present invention will be described.

Figure 10:
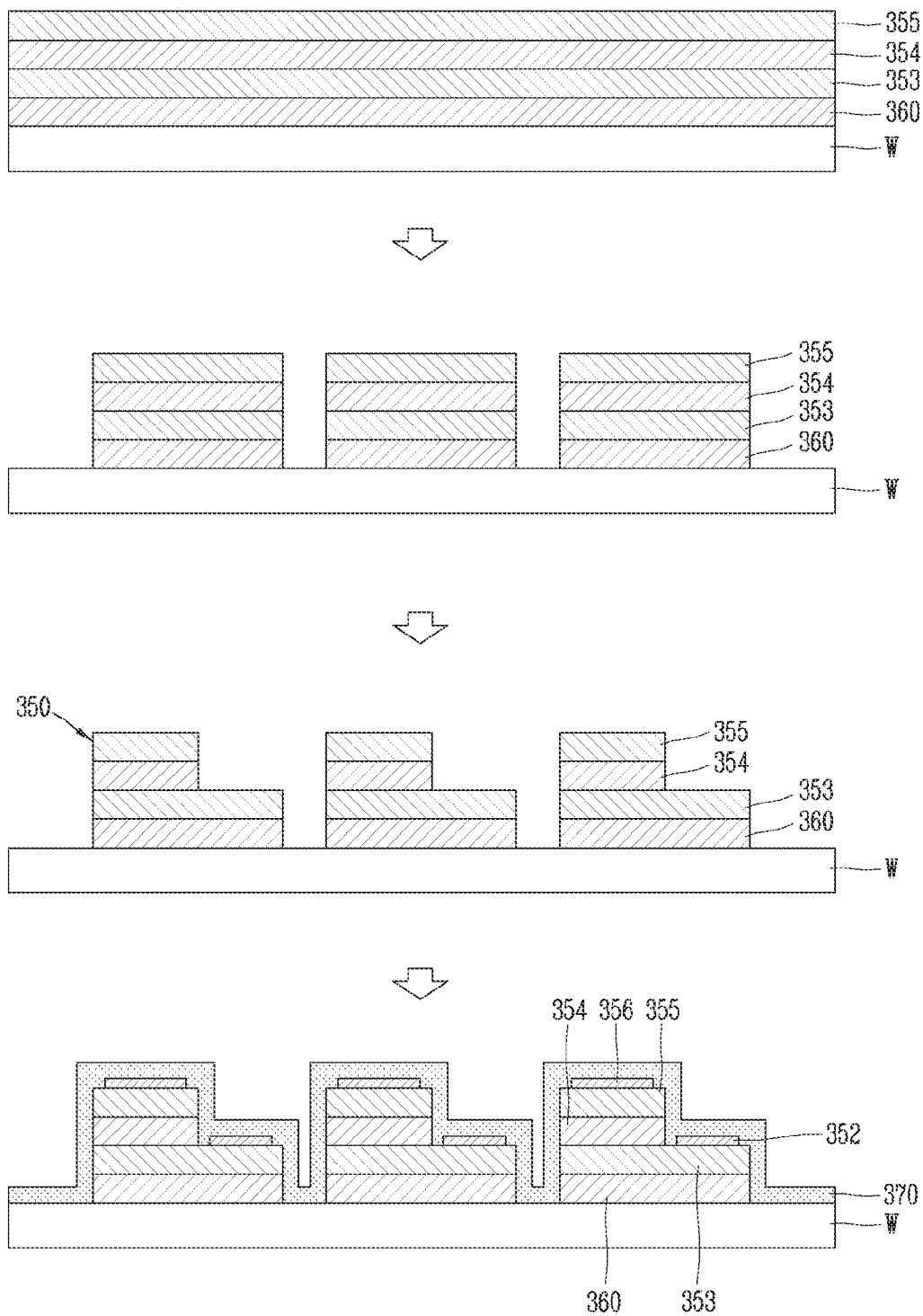
FIGS. 10 through 13 are conceptual views showing a method of manufacturing a display device according to the present disclosure.
Figure 11:
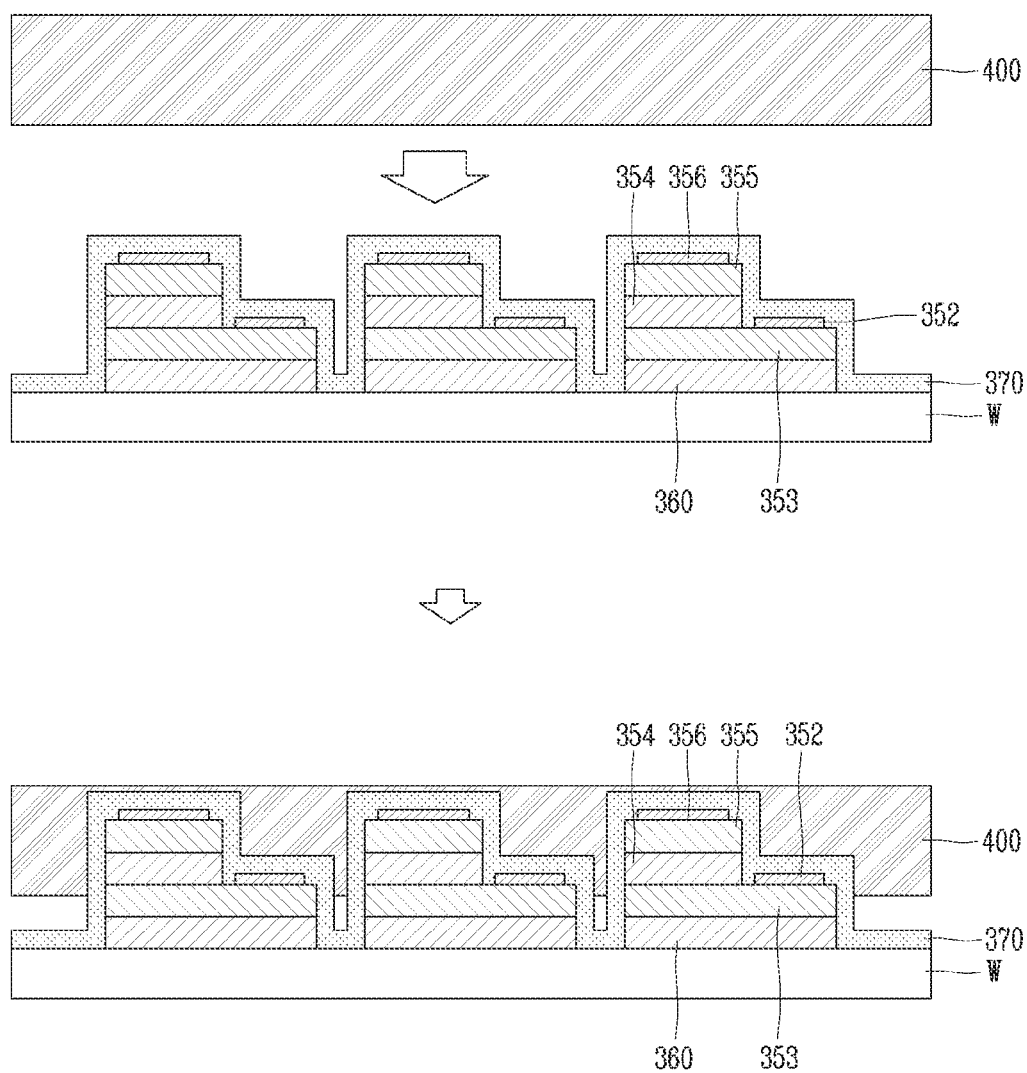
Figure 12:
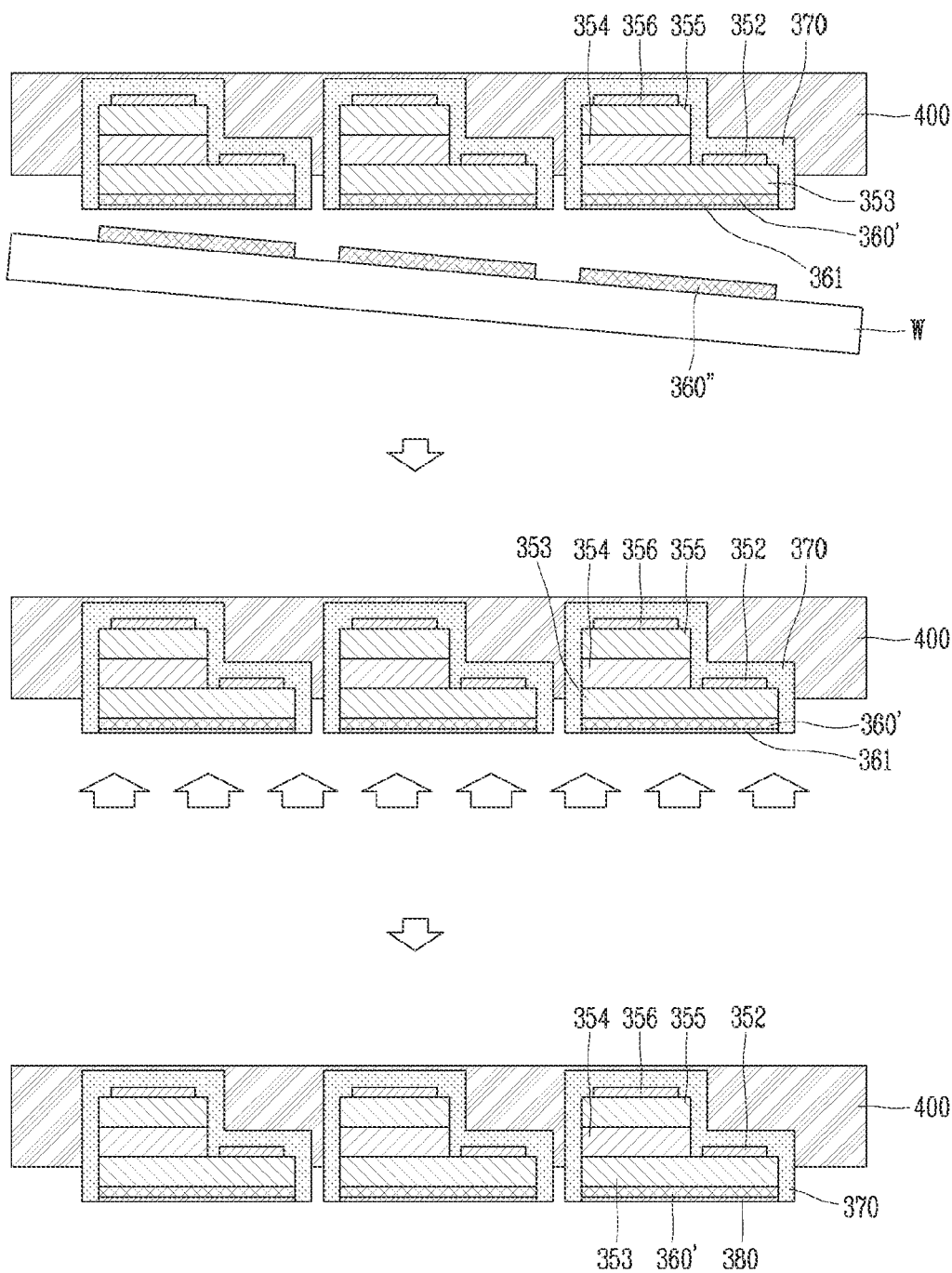

FIGS. 10 through 12 are conceptual views showing a method of manufacturing a display device according to the present disclosure.

First, a step of forming a plurality of semiconductor light-emitting elements on a growth substrate (W) is carried out.

Referring to FIG. 10, a buffer layer 360, a second conductive semiconductor layer 353, an active layer 354, and a first conductive semiconductor layer 355 may be sequentially deposited on a growth substrate (W), and then individual semiconductor light-emitting elements may be manufactured through an isolation and mesa process.

In one embodiment, the growth substrate (W) is a sapphire substrate, and a buffer layer, an undoped GaN layer, an n-GaN layer, a GaN MQWs layer, an InGaN layer, and a p-GaN layer may be sequentially deposited on the sapphire substrate, and then semiconductor light-emitting elements may be manufactured. In this case, the GaN MQWs layer and the InGaN layer may be referred to as active layers. On the other hand, the buffer layer and the undoped GaN layer may be made of the same material, and the two layers may not be distinguished.

Next, a step of forming conductive electrodes 352 and 356 on the surface of the semiconductor light-emitting element is carried out. The conductive electrodes 352 and 356 are formed on the first and second conductive semiconductor layers 353 and 355, respectively. The conductive electrodes 352 and 356 may be formed by a vapor deposition method, but the method of forming the conductive electrodes 352 and 356 is not additionally limited.

Next, a step of forming a passivation layer 370 on the semiconductor light-emitting element 350 is carried out. A material constituting the passivation layer 370 may include a dielectric material or a metal oxide material. For example, the passivation layer 370 may be formed of any one of $SiO2$, $SiOx$, $SiNx$, $ZnO$, $Al_2O_3$, $WOx$, $MoOx$, $TiO_2$, $NiO$, $CuOx$, and $HfOx$.

Next, referring to FIG. 11, a step of bonding the growth substrate (W) on which the semiconductor light-emitting element 350 is formed to a temporary substrate 400 is carried out. Here, a surface on which the semiconductor light-emitting element is formed between both surfaces of the growth substrate (W) is brought into contact with the temporary substrate 400.

The temporary substrate 400 may be an organic adhesive layer made of PSA or PDMS, but is not limited thereto. When the semiconductor light-emitting element 350 is later separated from the growth substrate (W) by a lift-off process, the temporary substrate 400 serves to protect the semiconductor light-emitting element 350 while at the same time serving as a donor substrate to transfer the semiconductor light-emitting element 350 to another substrate.

Next, a step of separating the semiconductor light-emitting element 350 from the growth substrate (W) is carried out. For example, the growth substrate (W) may be removed using a laser lift-off (LLO) method.

During the laser lift-off process, the semiconductor light-emitting element is separated from the growth substrate (W) while part of the buffer layer is destroyed. As a result, a part 360' of the buffer layer remains on a surface of the semiconductor light-emitting element 350, and the other part 360''' thereof remains on the growth substrate (W).

Specifically, as the buffer layer 360 absorbs laser light, gas is generated in the buffer layer, and a part of the buffer layer 360 is destroyed by the gas. When the laser light is absorbed at a specific depth of the buffer layer 360, the buffer layer 360 may be split into two layers. Through this, the semiconductor light-emitting element 350 and the growth substrate (W) are separated.

When the buffer layer 360 is made of GaN, the buffer layer 360 absorbs laser light to emit nitrogen gas, and the semiconductor light-emitting element is separated from the growth substrate (W). In this process, an auxiliary layer (or a Ga metal layer) 361 is formed on a surface of the buffer layer 360' remaining in the semiconductor light-emitting element 350.

Meanwhile, even though the buffer layer 360 is not made of GaN, when the laser lift-off method is used, a metal layer 361 may be formed on the surface of the buffer layer 360' remaining in the semiconductor light-emitting element 350.

In the related art, a process of removing the above-described Ga metal layer with an acid or a base was performed. The present disclosure does not remove the metal layer 361. The present disclosure includes a process of oxidizing a metal layer generated after performing the above-described laser lift-off process.

Figure 13:
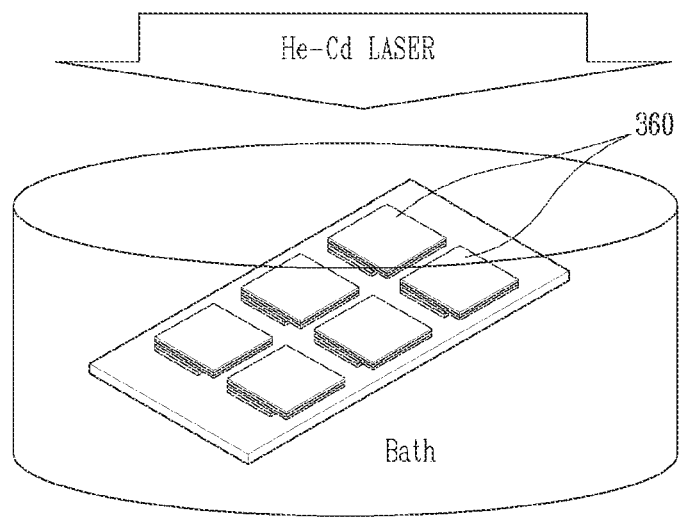

Specifically, the step of oxidizing the metal layer 361 may be performed by irradiating the metal layer 361 with a laser. In one embodiment, referring to FIG. 13, when the metal layer 361 is made of Ga, the laser is a He—Cd laser, and laser may be irradiated while the semiconductor light-emitting element is immersed in a pH 3.5 phosphoric acid solution or a pH 11 to 13 potassium hydroxide solution to oxidize the Ga metal layer. Accordingly, the Ga metal layer 361 is oxidized to $Ga_2O_3$.

In terms of light transmittance, a thickness of the metal oxide layer is preferably 100 to 500 nm. Meanwhile, a specific resistance value of the metal oxide layer must be greater than that of the conductive semiconductor layer. For example, a specific resistance value, which is an electrical characteristic, of $Ga_2O_3$ is $1^{E10}$ Ωcm, which can significantly reduce electrical leakage in a panel operating environment (high-temperature high-humidity).

Meanwhile, a step of forming the metal oxide layer may be performed after forming nanopores on a surface of the buffer layer. Specifically, the step of forming nanopores on the surface of the buffer layer may be performed after separating the semiconductor light-emitting element from the growth substrate (W).

The step of forming nanopores may be performed through electrolysis. Specifically, when a voltage is applied while the buffer layer is immersed in an electrolyte solution, a material constituting the buffer layer is decomposed to form nanopores.

For example, when electrolyzing a buffer layer made of GaN, nanopores are generated while generating Ga metal and $N_2$ gas. In this case, the GaN layer must be doped with dopants having a predetermined concentration. In the case of an undoped GaN layer, electrolysis may not occur well.

During the above-described electrolysis, nanopores are formed in a direction toward the conductive semiconductor layer formed under the buffer layer. Depending on the electrolysis conditions, the size and number of nanopores may vary. A depth of the nanopores is preferably 0.5 to 1 μm, and a particle size of the nanopores is preferably 50 to 100 nm.

During the above-described electrolysis, the metal layer formed on the surface of the buffer layer is removed. Accordingly, the surface of the buffer layer and an inner wall of the nanopores are made of a material forming the buffer layer. For example, when the buffer layer is GaN, the surface of the buffer layer and the inner wall of the nanopores are made of GaN during electrolysis.

Next, in order to oxidize the surface of the buffer layer and the inner wall of the nanopores, an electrochemical reaction may be performed. The electrochemical reaction may be performed by irradiating light having a predetermined wavelength while the buffer layer is immersed in a predetermined solution. For example, in case where the buffer layer is made of GaN, when the buffer layer is irradiated with UV light while being immersed in an electrolyte solution, the surface of the buffer layer and the inner wall of the nanopores are oxidized to $Ga_2O_3$.

Accordingly, an oxide layer, such as the metal oxide layer is formed on the surface of the buffer layer including the inner wall of the nanopores. The above-described metal oxide layer may insulate the conductive semiconductor layer and the buffer layer, thereby preventing current leakage through the buffer layer in a high-temperature and high-humidity environment.

Hereinafter, the structure of the semiconductor light-emitting element manufactured by the foregoing manufacturing method will be described in detail.

Figure 14:
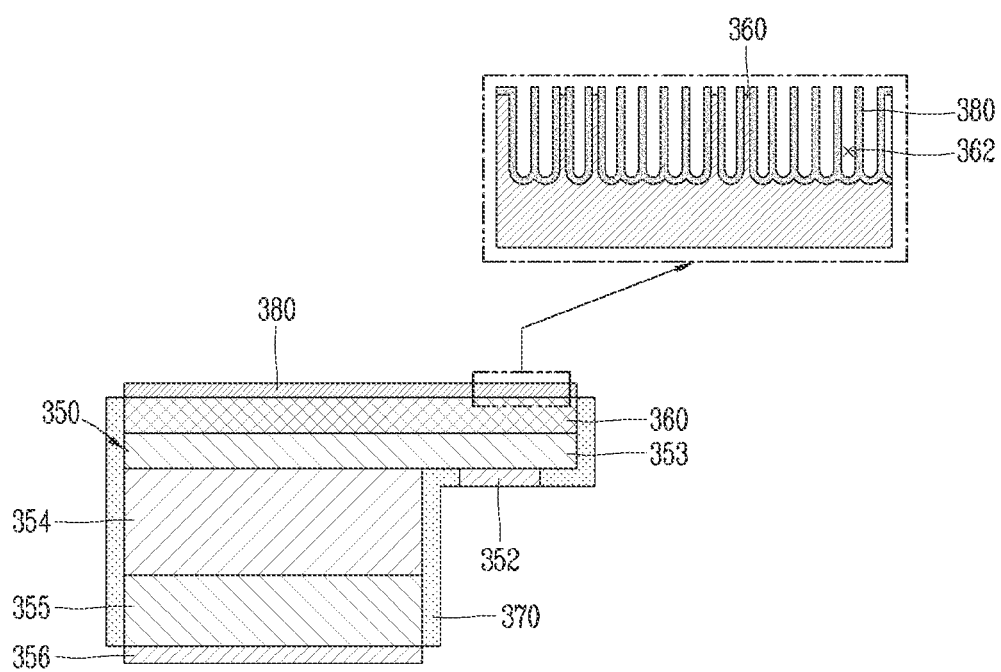
FIG. 14 is a conceptual view showing a cross section of a semiconductor light-emitting element according to the present disclosure.

FIG. 14 is a conceptual view showing a cross section of a semiconductor light-emitting element according to the present disclosure.

The plurality of semiconductor light-emitting elements 350 included in a display device according to the present disclosure include a butler layer 360 and an oxide layer (or a metal oxide layer) 380 formed on the buffer layer 360.

Here, the metal oxide layer 380 is made of an oxide of the buffer layer 360. In other words, the metal oxide layer 380 is formed by oxidizing the buffer layer 360 itself, or by oxidizing a reduction product of the buffer layer 360.

For example, when the buffer layer is made of GaN, the metal oxide layer is formed by oxidizing a Ga metal layer or by oxidizing GaN itself. In this case, the metal oxide layer may be formed of $Ga_2O_3$.

The semiconductor light-emitting element 350 includes a first conductive semiconductor layer 355 formed on the wiring electrode, an active layer 354 deposited on the first conductive semiconductor layer 355, and a second conductive semiconductor layer 353 deposited on the active layer 354, and the buffer layer 360 is deposited on the second conductive semiconductor layer 353.

The semiconductor light-emitting element 350 described below is a flip-chip type semiconductor light-emitting element described in FIG. 4, but the structure according to the present disclosure may also be applied to a vertical semiconductor light-emitting element.

Meanwhile, the buffer layer 360 is formed on one surface of the second conductive semiconductor layer 353. The buffer layer 360 is a layer remaining on the semiconductor light-emitting element 360 after lifting off the semiconductor light-emitting element 350 from the growth substrate (W). The buffer layer 360 may be an undoped semiconductor layer or a semiconductor layer doped with dopants having a relatively small concentration compared to the first and second conductive semiconductor layers.

The metal oxide layer 380 is formed on a surface different from a surface in contact with the second conductive semiconductor layer 353 between both sides of the buffer layer 360

A material constituting the metal oxide layer 380 may vary depending on the material constituting the buffer layer 360. For example, the metal oxide layer 380 may be formed of any one of gallium oxide, silicon oxide, aluminum oxide, silicon carbide, and titanium oxide.

Meanwhile, the buffer layer 360 may include a plurality of nanopores 362. The nanopores 362 are formed on a surface in contact with the metal oxide layer 380 between both surfaces of the buffer layer 360.

The nanopores 362 have a particle size of 50 to 100 nm, and are preferably formed with a depth of 0.5 to 1 μm in a direction from the surface of the buffer layer 360 toward the second conductive semiconductor layer 353.

Here, the metal oxide layer 380 is also formed on an inner wall of the nanopores 362. Accordingly, light emitted from the active layer 354 of the semiconductor light-emitting element 350 to the outside through the second conductive semiconductor layer passes through the metal oxide layer 380 in embodiments, a portion of the buffer layer 360 can be interposed between inner walls of adjacent nanopores 362, or adjacent nanopores 362 can be defined or separated b inner walls.

The display device according to the present disclosure may further include a light-transmitting layer covering the semiconductor light-emitting elements 350 in order to improve planarization and light uniformity. Due to a difference in refractive index between the conductive semiconductor layer and the light-transmitting layer, total reflection may occur at an interface between the semiconductor light-emitting element and the light-transmitting layer. This causes a decrease in the light efficiency of the display device.

A refractive index of the metal oxide layer 380 may be between those of the light-transmitting layer and the second conductive semiconductor layer. In this case, the metal oxide layer 380 reduces total reflection occurring at an interface between the semiconductor light-emitting element and the light-transmitting layer, thereby increasing the light efficiency of the display device.

In terms of light transmittance, a thickness of the metal oxide layer 380 is preferably 100 to 500 nm. Meanwhile, a specific resistance value of the metal oxide layer 380 must be greater than that of the conductive semiconductor layer. For example, a specific resistance value, which is an electrical characteristic, of $Ga_2O_3$ is $1^{E10}$ Ωcm, which can significantly reduce electrical leakage in a panel operating environment (high-temperature high-humidity).

Meanwhile, a passivation layer 370 may be formed on the surface of the semiconductor light-emitting element 350. The passivation layer 370 is formed to cover a side surface of the semiconductor light-emitting element 350, which is a surface that is not covered by a conductive electrode. The metal oxide layer 380 is not covered by the passivation layer 370.

According to the present disclosure, a metal layer formed on a surface of the semiconductor light-emitting element may be oxidized by a laser lift-off method, thereby removing the metal layer without exposing the semiconductor light-emitting element to an acid or a base.

Furthermore, according to the present disclosure, a metal layer formed on a surface of the semiconductor light-emitting element may be oxidized by a laser lift-off method, thereby insulating the surface of the semiconductor light-emitting element exposed to the outside by the laser lift-off method without adding a process of forming an additional insulating layer.

What is claimed is:

1. A display device, comprising:
   a substrate having a wiring electrode; and
   a plurality of semiconductor light-emitting elements electrically connected to the wiring electrode,
   wherein each of the plurality of semiconductor light-emitting elements comprises:
   a buffer layer;
   an oxide layer formed on the buffer layer;
   a first conductive semiconductor layer formed on the wiring electrode;
   an active layer deposited on the first conductive semiconductor layer; and
   a second conductive semiconductor layer deposited on the active layer,
   wherein the oxide layer is made of an oxide of the buffer layer,
   wherein the buffer layer is deposited on the second conductive semiconductor layer,
   wherein the oxide layer is formed on a surface different from a surface in contact with the second conductive semiconductor layer among surfaces of the buffer layer,
   wherein the buffer layer comprises a plurality of nanopores,
   wherein the nanopores are formed on the surface in contact with the oxide layer among the surfaces of the buffer layer, and
   wherein the oxide layer is formed on a surface of the buffer layer and on an inner wall of the plurality of nanopores.

2. The display device of claim 1, wherein the oxide layer is made of any one of gallium oxide, silicon oxide, aluminum oxide, silicon carbide, and titanium oxide.

3. The display device of claim 1, wherein a size of the plurality of nanopores is approximately 50 to 100 nm.

4. The display device of claim 1, wherein the plurality of nanopores are formed with a depth of approximately 0.5 to 1 μm in a direction toward the second conductive semiconductor layer.

5. The display device of claim 1, further comprising:
   a light-transmitting layer disposed to cover the oxide layer,
   wherein a refractive index of the oxide layer is between those of the light-transmitting layer and the second conductive semiconductor layer.

6. A method of manufacturing a display device, the method comprising:
   forming a plurality of semiconductor light-emitting elements on a growth substrate;
   forming a passivation layer on the plurality of semiconductor light-emitting elements;
   bonding the plurality of semiconductor light-emitting elements of the growth substrate to a temporary substrate;
   separating the plurality of semiconductor light-emitting elements from the growth substrate using a laser lift-off method; and
   oxidizing a surface of the plurality of semiconductor light-emitting elements, wherein each of the plurality of semiconductor light-emitting elements separated from the growth substrate has a buffer layer, wherein the oxidizing of the surface of the plurality of semiconductor light-emitting elements oxidizes a surface of the buffer layer, and wherein the surface of the buffer layer is oxidized using a light irradiated from a laser while the plurality of light-emitting elements are immersed in a solution.

7. The method of claim 6, further comprising arranging the plurality of semiconductor light-emitting elements on a substrate of the display device, wherein the substrate includes a wiring electrode to which the plurality of semiconductor light-emitting elements are electrically connected.

8. The method of claim 6, wherein the oxidizing of the surface of the plurality of semiconductor light-emitting elements oxidizes the surface of the buffer layer to form a plurality of nanopores on a surface of the buffer layer.

9. The method of claim 6, wherein the solution is one of a phosphoric acid solution or a potassium hydroxide solution.

10. The display device of claim 1, wherein a portion of the buffer layer is interposed between inner walls of an adjacent pair of the plurality of nanopores.

11. The display device of claim 1, wherein the oxide layer forms inner walls of the plurality of nanopores.

12. A display device, comprising:
a substrate having a wiring electrode; and
a plurality of semiconductor light-emitting elements electrically connected to the wiring electrode,
wherein each of the plurality of semiconductor light-emitting elements comprises:
a buffer layer; and
an auxiliary layer on the buffer layer,
wherein the auxiliary layer includes an oxide of the buffer layer,
wherein the auxiliary layer further includes a plurality of nanopores,
wherein the plurality of nanopores include sidewalls formed of the oxide of the buffer layer, and
wherein the auxiliary layer further includes a portion of the buffer layer, and the portion of the buffer layer is interposed between sidewalls of an adjacent pair of the plurality of nanopores.

13. The display device of claim 12, wherein the buffer layer includes GaN, and the oxide is $Ga_2O_3$.

* * * * *